United States Patent
Choi

(10) Patent No.: US 7,067,921 B2
(45) Date of Patent: Jun. 27, 2006

(54) METHOD FOR FABRICATING A METAL-INSULATOR-METAL CAPACITOR IN A SEMICONDUCTOR DEVICE

(75) Inventor: Chee Hong Choi, Busan (KR)

(73) Assignee: Dongbu Electronics, Inc., Seoul (KR)

( * ) Notice: Subject to any disclaimer, the term of this patent is extended or adjusted under 35 U.S.C. 154(b) by 0 days.

(21) Appl. No.: 10/758,150

(22) Filed: Jan. 15, 2004

(65) Prior Publication Data
US 2005/0042820 A1 Feb. 24, 2005

(30) Foreign Application Priority Data
Aug. 18, 2003 (KR) ...................... 10-2003-0056827

(51) Int. Cl.
*H01L 23/52* (2006.01)
(52) U.S. Cl. ...................... 257/758; 438/622
(58) Field of Classification Search ................ 438/253, 438/396, 622–675; 257/306, 758
See application file for complete search history.

(56) References Cited

U.S. PATENT DOCUMENTS

| | | | |
|---|---|---|---|
| 5,351,163 A | | 9/1994 | Dawson et al. |
| 5,972,722 A | * | 10/1999 | Visokay et al. ................ 438/3 |
| 6,387,750 B1 | | 5/2002 | Lai et al. |
| 6,784,069 B1 | * | 8/2004 | Patraw et al. ................ 438/396 |
| 2004/0137693 A1 | * | 7/2004 | Kim ........................... 438/393 |
| 2004/0152256 A1 | * | 8/2004 | Noguchi et al. ............ 438/250 |

FOREIGN PATENT DOCUMENTS

| | | |
|---|---|---|
| KR | 10-1998-0034728 | 8/1998 |
| KR | 10-2001-00013685 | 3/2001 |
| KR | 10-2001-0088733 | 12/2001 |

OTHER PUBLICATIONS

Olewine et al., Publication No. US 2003/0067023, Apr. 10, 2003.

\* cited by examiner

*Primary Examiner*—David Nelms
*Assistant Examiner*—Calvin Lee
(74) *Attorney, Agent, or Firm*—Saliwanchik, Lloyd & Saliwanchik

(57) ABSTRACT

A method of fabricating a metal-insulator-metal capacitor in a semiconductor device is disclosed. An example method for fabricating an MIM capacitor of a semiconductor device deposits a metal layer to be used as a lower electrode of an MIM capacitor, deposits a sacrificial layer on the metal layer, and removes some part of the sacrificial layer to form the MIM capacitor thereon. In addition, the example method deposits a dielectric layer and an upper metal layer and forms the MIM capacitor by patterning the dielectric layer and the upper metal layer.

10 Claims, 6 Drawing Sheets

--PRIOR ART--

--PRIOR ART--

Fib. 1c
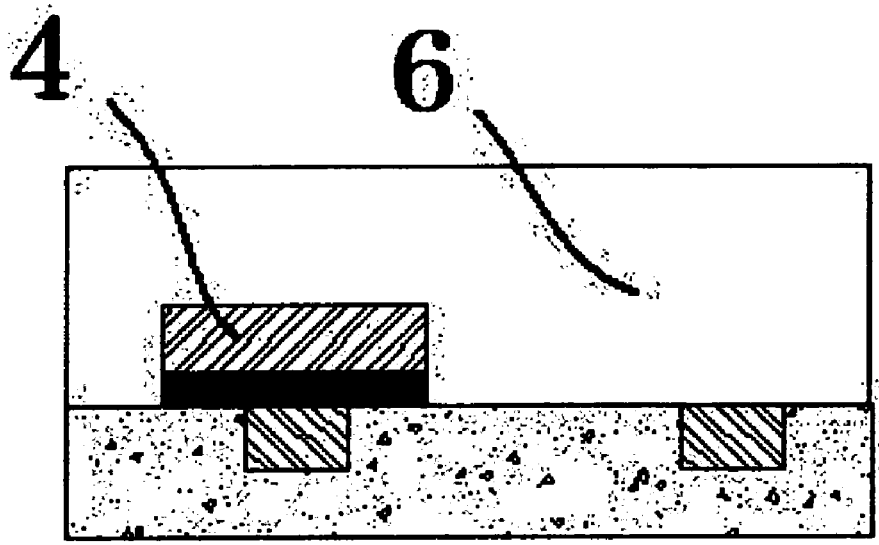
--PRIOR ART--
Fig. 1d
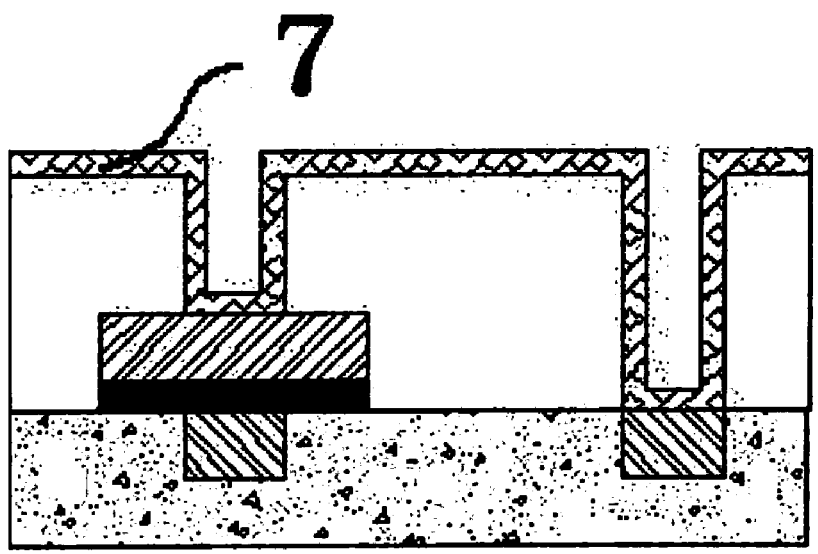
--PRIOR ART--

--PRIOR ART--

--PRIOR ART--

METHOD FOR FABRICATING A METAL-INSULATOR-METAL CAPACITOR IN A SEMICONDUCTOR DEVICE

FIELD OF THE DISCLOSURE

The present disclosure relates generally to semiconductor devices and, more particularly, to a method of fabricating a metal-insulator-metal capacitor in a semiconductor device.

BACKGROUND

In fabricating highly-integrated memory devices, a capacitor has to provide a relatively high capacitance in a small area. Conventionally, capacitance can be increased by forming a capacitor using a dielectric layer with a large dielectric constant, forming a thin dielectric layer, and/or increasing a cross-sectional area of a capacitor.

Known multi-layered capacitors or trench-type capacitors have been used to increase a cross-sectional area of a capacitor. A half-spherical polysilicon layer has also been used to that end. However, these known technologies tend to complicate a capacitor structure, reduce process yield, and increase manufacturing cost.

Dielectric materials including $SiO_2/Si_3N_4$ are used as commonly used as a dielectric layer of a capacitor. Based on the material used for a capacitor electrode, a polysilicon-insulator-polysilicon (PIP) capacitor structure or a metal-insulator-metal (MIM) capacitor structure may be employed. Thin film capacitors such as PIP capacitors and MIM capacitors are used in analog semiconductor devices requiring precise capacitance values because, in contrast to MOS capacitors and junction capacitors, these capacitors are independent of bias.

In addition, although the MIM capacitor has a disadvantage because it has smaller capacitance per unit area than that of the PIP capacitor, the former has better VCC (voltage coefficient for capacitance) and TCC (temperature coefficient for capacitance) according to voltage and temperature as compared to the PIP capacitor.

FIGS. 1a through 1f illustrate, in cross-sectional views, the process steps of a known capacitor-fabricating method. Referring to FIG. 1a, a dielectric layer 3 is deposited on a lower metal layer 2 and a substrate 1 with at least a predetermined structure, and an upper metal layer 4 is deposited on the dielectric layer. Referring to FIG. 1b, a MIM capacitor 5 is formed by etching simultaneously the dielectric layer and the upper metal layer using a mask (not shown). Referring to FIG. 1c, an interlayer dielectric 6 is formed on all of the area of the substrate with the MIM capacitor. Referring to FIG. 1d, the interlayer dielectric is etched to form a via hole that connects the upper metal layer and the lower metal layer, respectively, with an uppermost metal layer, and a barrier metal layer 7 is deposited on the via hole. Referring to FIG. 1e, the via hole is filled with a metal plug 8 and flattened to complete the contact via hole. Referring to FIG. 1f, a metal layer is deposited on the metal plug 8 and patterned to form an uppermost metal layer 9, thereby completing a MIM capacitor.

Korean Patent Publication No. 10-2003-0058317 discloses a MIM capacitor fabricating method that forms an etch stopping layer to prevent the interlayer dielectric from being attacked by etching solution and eliminating an oxide supporting a lower electrode. Another Korean Patent Publication No. 10-2002-0073822 discloses a method of fabricating a MIM capacitor that provides good step coverage and a uniform dielectric layer and forms spacers on lateral walls of a lower electrode.

However, in these conventional methods the process of forming an MIM capacitor by etching simultaneously an upper metal layer and a dielectric layer, causes a fringing effect at the edge of the MIM capacitor, and is accompanied by bridge, which increases leakage current. The bridge is generated by redeposition of metal etched from the lower metal layer during over-etching necessary for etching a dielectric layer of MIM capacitor. To obviate these problems, the formation of spacers on a lower electrode has been proposed, but such spacers do not completely prevent the bridge due to the difficulty in controlling the process and, in some cases, may significantly complicate processing.

BRIEF DESCRIPTION OF THE DRAWINGS

FIGS. 1a through 1f illustrate, in cross-sectional views, known the processing steps.

DETAILED DESCRIPTION

As described above, known methods of fabricating an MIM capacitor etch an upper metal layer and a dielectric layer simultaneously using an etch stopping layer formed on a lower metal layer. In addition, these known methods use over-etching to remove the remaining dielectric layer on the lower metal layer. The metal generated by etching of the lower metal layer is redeposited to induce a bridge between the upper and the lower metal layers, which leads to an increase in the leakage current.

In contrast, the example method described below in connection with FIGS. 2a through 2f, uses a sacrificial layer of silicon oxide to protect the lower metal layer despite over-etching.

An example method for fabricating an MIM capacitor of semiconductor device deposits a metal layer to be used as a lower electrode of the MIM capacitor, deposits a sacrificial layer on the metal layer, removes some area of the sacrificial layer to form an MIM capacitor thereon, deposits a dielectric layer and an upper metal layer, and forms an MIM capacitor by patterning the dielectric layer and the upper metal layer.

Figure 1A:
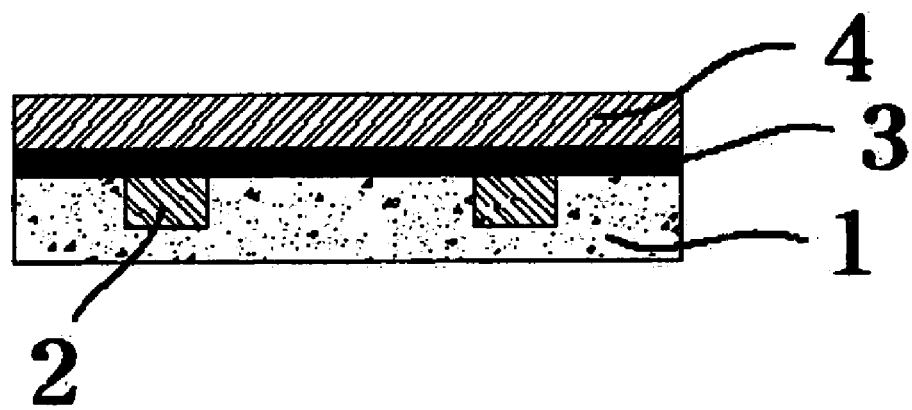
Figure 1B:
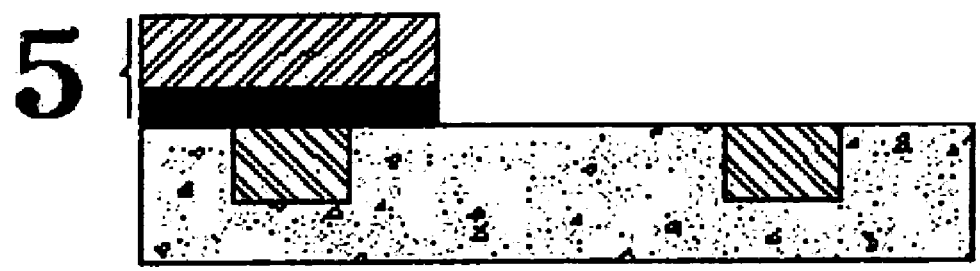
Figure 1E:
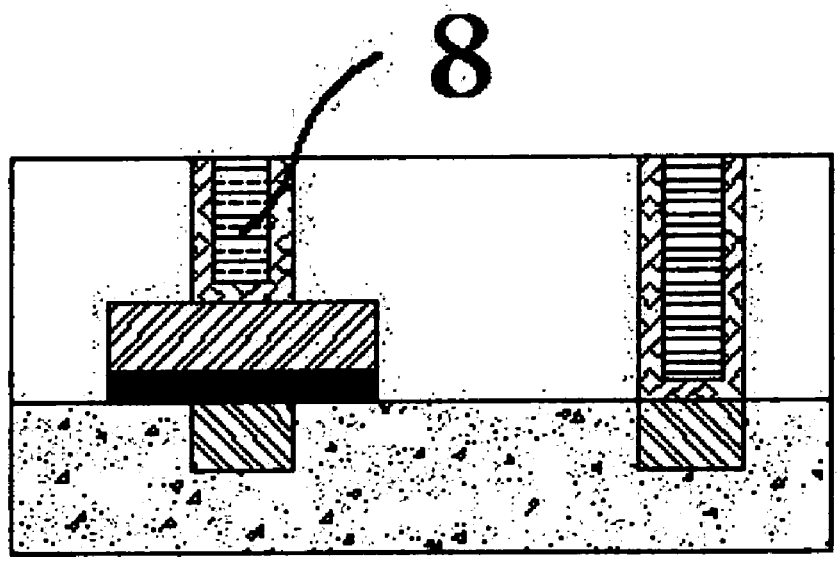
Figure 1F:
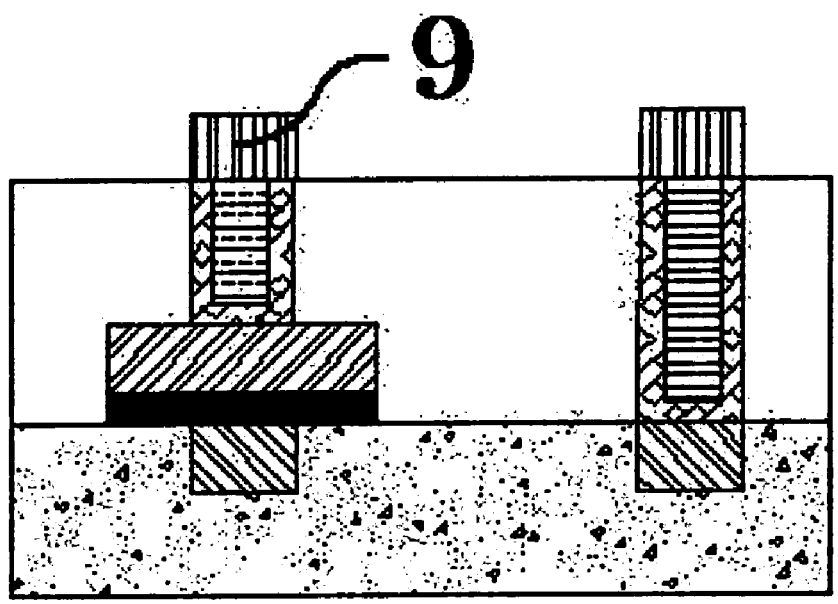
Figure 2A:
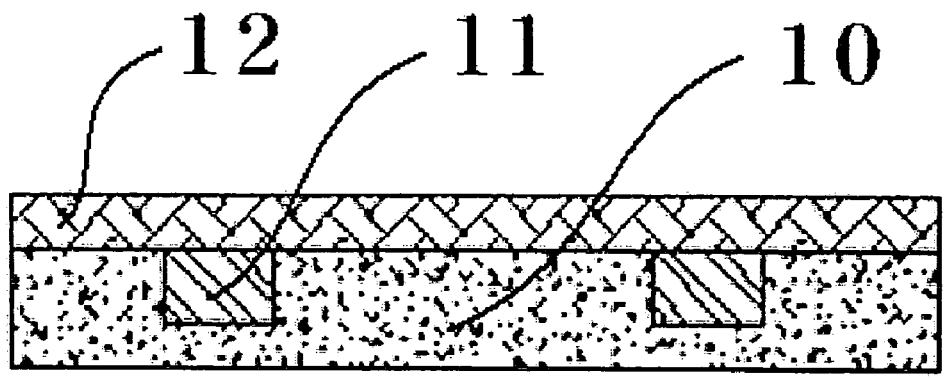
FIGS. 2a through 2f illustrate, in cross-sectional views, an example method for fabricating an MIM capacitor.

Referring to FIG. 2a, a metal layer to be used as a lower electrode of an MIM capacitor is deposited on a substrate 10 with a predetermined structure. The metal layer is patterned to form a lower metal layer 11. Then, a sacrificial layer 12 is deposited by chemical vapor deposition. The sacrificial layer is used as an etch stopping layer in etching an interlayer dielectric. The sacrificial layer is silicon oxide or silicon nitride and has a thickness of 100~200Å.

Figure 2B:
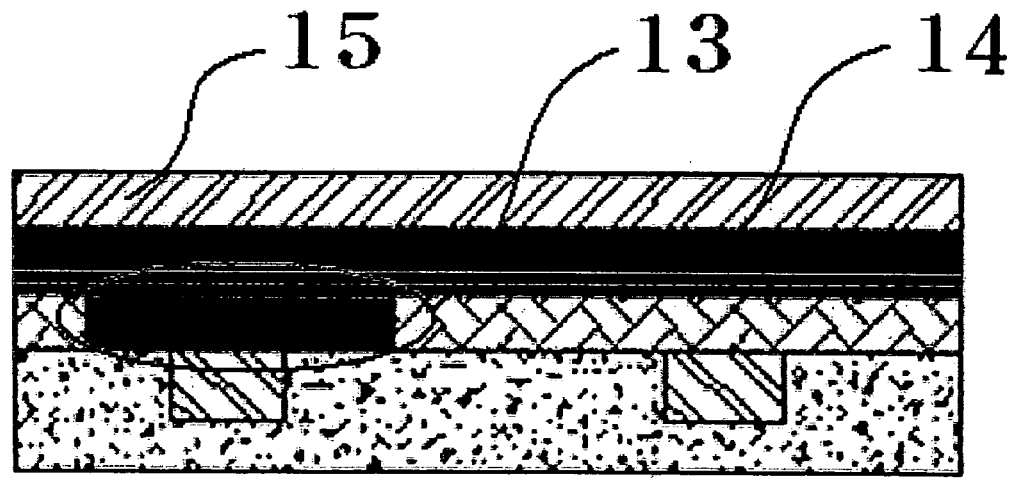

Referring to FIG. 2b, the sacrificial layer is patterned using a photoresist process, and some area 13 on which an MIM capacitor is formed is removed by dry-etch or wet-etch. Then, a dielectric layer 14 and an upper metal layer 15 are deposited in sequence. The dielectric layer is formed by chemical vapor deposition or atomic layer deposition using a material such as SiN, $SiO_2$, $Al_2O_3$, TaON, $TiO_2$, $Ta_2O_5$, $ZrO_2$, $(Ba,Sr)TiO_3$ (hereinafter referred to as "BST"), $(Pb,Zr)TiO_3$ (hereinafter referred to as "PZT"), or $(Pb,La)(Zr,Ti)O_3$ (hereinafter referred to as "PLZT"). The dielectric layer is a single layer or multi-layer with a thickness of 200~1000Å. The thickness of a combination of the sacrificial layer and the dielectric layer may be substantially uniform as illustrated in FIG. 2b.

Figure 2C:
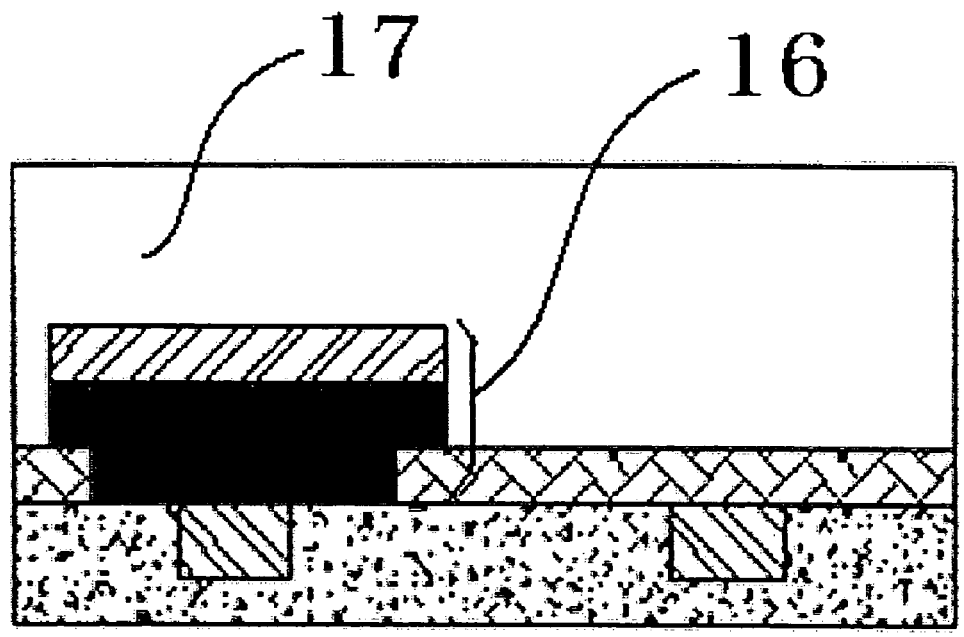

Referring to FIG. 2c, an MIM capacitor 16 is formed through patterning and etching the dielectric layer and the lower metal layer and, then, an interlayer dielectric 17 is deposited. The interlayer dielectric may be silicon oxide complex, and is used as an etch stopping layer in etching the dielectric layer and the lower metal layer.

Figure 2D:
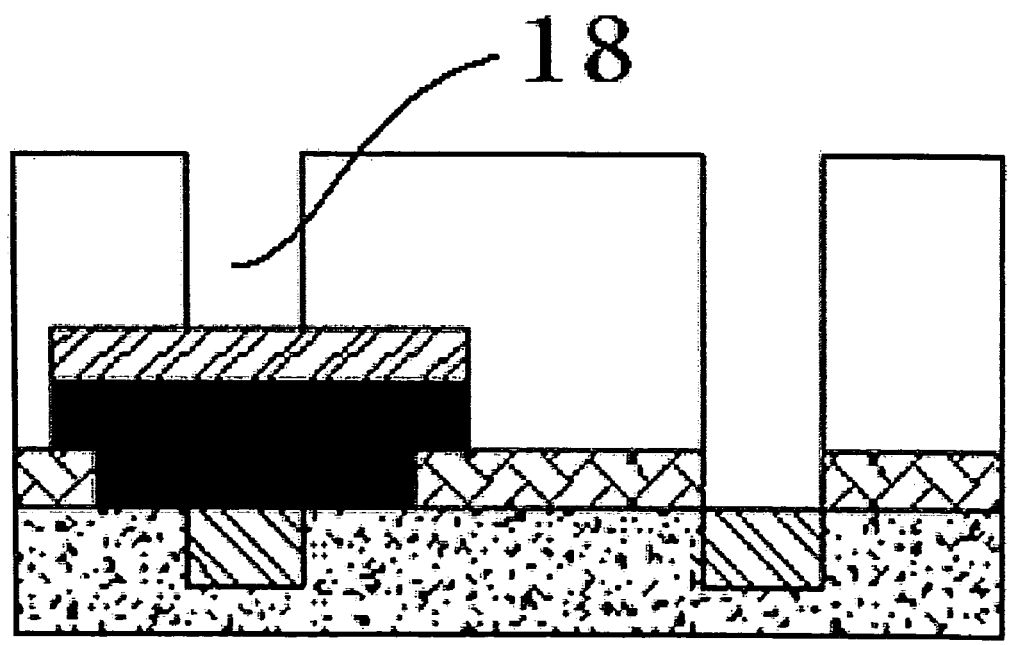
Figure 2E:
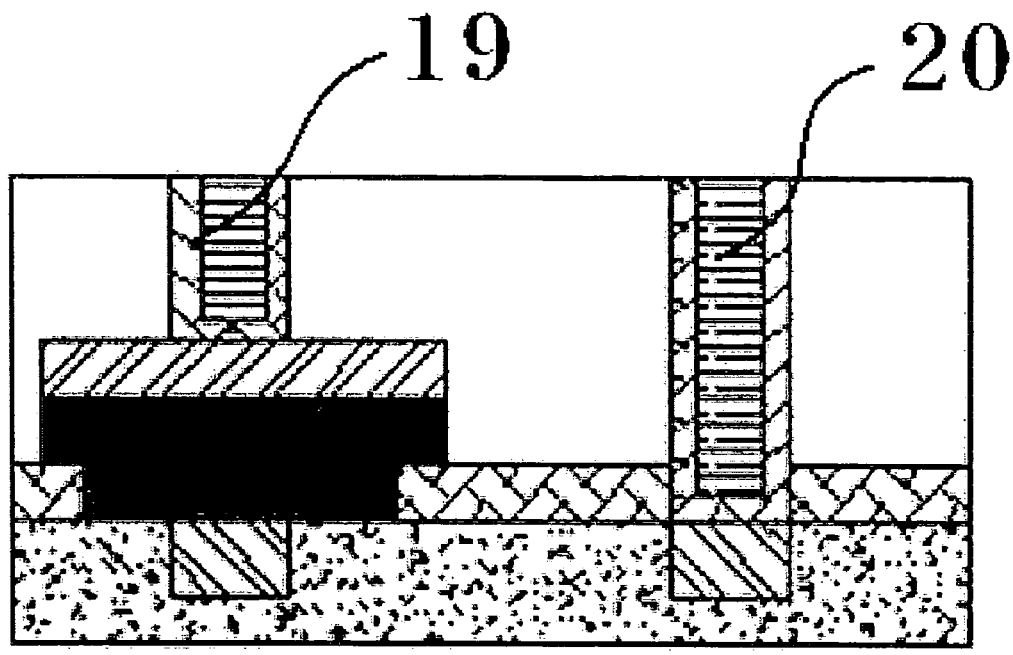

Referring to FIG. 2d, a via hole 18 is formed. The sacrificial layer on the lower metal layer is etched during the formation of the via hole. Then, as shown in FIG. 2e, the via hole of which a barrier metal layer 19 is deposited on the bottom and the lateral walls is filled with a metal plug 20 and flattened to form a contact via hole. The metal plug is made from a metal selected from the group of tungsten, copper family elements, and platinum family metals. The barrier metal layer is made of a high fusion point metal or nitride thereof, for example, TaN, Ta/TaN, TiN, or Ti/TiN, and is a single layer or multi-layer. The high fusion point metal means a metal having a higher fusion point than that of iron (Fe), 1,535° C.

Figure 2F:
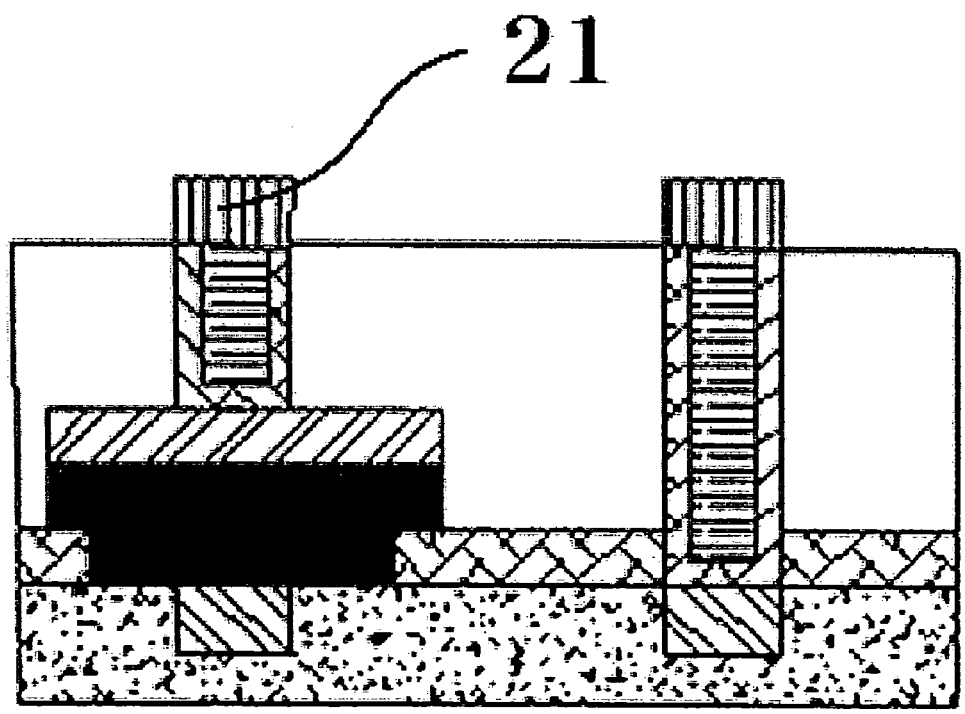

Referring to FIG. 2f, a metal layer is deposited and patterned to form an uppermost metal layer 21 and, finally, the contact is completed.

In the above-mentioned processes, the metal layers of the MIM capacitor are made of aluminum, a transition element, or an alloy consisting of aluminum and a transition element.

The above-described example method for fabricating an MIM capacitor can prevent increase in leakage current due to redeposition because a sacrificial layer is used to protect a lower metal layer in spite of over-etching.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. An MIM capacitor of a semiconductor device comprising:
    a substrate;
    a lower metal layer in contact with the substrate;
    a sacrificial layer in contact with the substrate and patterned to reveal an area of the lower metal layer;
    dielectric layer in contact with the lower metal layer, the substrate surface, and the sacrificial layer wherein the thickness of the sacrificial layer and the dielectric layer is substantially uniform; and
    upper metal layer in contact with the dielectric layer.

2. The MIM capacitor as defined in claim 1, further comprising:
    an interlayer dielectric in contact with the upper metal layer;
    a via hole through the interlayer dielectric in contact with the dielectric layer;
    a barrier metal layer disposed in the via hole;
    a plug metal in contact with the barrier layer; and
    an uppermost metal layer disposed over the via hole.

3. The MIM capacitor as defined by claim 2, wherein the metal is selected from the group of tungsten, copper family metals, and platinum family metals.

4. The MIM capacitor as defined by claim 2, wherein the barrier metal layer is made of a high fusion point metal or nitride thereof, and wherein the barrier metal layer is configured to have one of a single layer structure or a multi-layer structure.

5. The MIM capacitor as defined by claim 1, wherein the sacrificial layer is used as an etch stopping layer.

6. The MIM capacitor as defined by claim 1, wherein the sacrificial layer is silicon oxide or silicon nitride.

7. The MIM capacitor as defined by claim 1, wherein the sacrificial layer has a thickness of 100~200Å.

8. The MIM capacitor as defined by claim 1, wherein the dielectric layer is made of a material selected from the group of SiN, $SiO_2$, $Al_2O_3$, TaON, $TiO_2$, $Ta_2O_5$, $ZrO_5$, $(Ba,Sr)TiO_3$, $(Pb,Zr)TiO_3$, and $(Pb,La)(Zr,Ti)O_3$, and wherein the dielectric layer is configured to have one of a single layer structure or a multi-layer structure.

9. The MIM capacitor as defined by claim 1, wherein the dielectric layer has a thickness of 200~1000Å.

10. The MIM capacitor as defined by claim 1, wherein the upper and the lower metal layers of the MIM capacitor are made of at least one of aluminum and a transition element.

* * * * *